United States Patent [19]
Kleinschmidt et al.

[11] 4,431,934
[45] Feb. 14, 1984

[54] ELECTRICALLY ACTUATED PIEZOELECTRIC CONTROL ELEMENT

[75] Inventors: Peter Kleinschmidt; Max Göpfert, both of Munich, Fed. Rep. of Germany

[73] Assignee: Siemens Aktiengesellschaft, Berlin & Munich, Fed. Rep. of Germany

[21] Appl. No.: 315,359

[22] Filed: Oct. 27, 1981

[30] Foreign Application Priority Data

Oct. 28, 1980 [DE] Fed. Rep. of Germany ....... 3040563

[51] Int. Cl.³ ............................................. H01L 41/04
[52] U.S. Cl. .................................................. 310/331
[58] Field of Search ............... 310/328, 334, 323, 337, 310/26, 333, 331

[56] References Cited

U.S. PATENT DOCUMENTS

| | | | |
|---|---|---|---|
| 2,616,223 | 11/1952 | Jonker | 310/334 |
| 3,102,210 | 8/1963 | Dory et al. | 310/334 |
| 3,748,503 | 7/1973 | Cobarg et al. | 310/331 |
| 4,195,243 | 3/1980 | Thaxter | 310/317 |
| 4,245,172 | 1/1981 | Shirley | 310/332 |
| 4,272,200 | 6/1981 | Hehl | 400/124 |

OTHER PUBLICATIONS

"Electrical Driving Circuits", –Publisher unknown, source unknown, publication date prior to May 23, 1980.

Primary Examiner—J. D. Miller
Assistant Examiner—D. L. Rebsch
Attorney, Agent, or Firm—Hill, Van Santen, Steadman & Simpson

[57] ABSTRACT

An electrically actuated control and positioning element formed of a lamella packet as a piezoelectric transducer whose ends are designed to form a power transmission element, and which is capable of transmitting tensile forces. Lamellae spaced from one another engage with parts of the power transmission element, preferably in a dovetailing or interlocking manner. Further active lamellae may be situated in the spaces between the spaced lamellae.

17 Claims, 8 Drawing Figures

ELECTRICALLY ACTUATED PIEZOELECTRIC CONTROL ELEMENT

BACKGROUND OF THE INVENTION

The present invention relates to a control or positioning element which is an electrically actuated transducer formed of a plurality of lamellae of piezoelectric material. The lamellae are combined to form a packet. The length of the lamellae are at least five times as great as a thickness of the individual lamella and the lamellae all have a substantially same thickness. A length of the lamellae from end to end shortened or lengthen upon application of an electrical voltage depending on the operational sign of the voltage and the polarization of the material.

Known from the prior art is a control or positioning element constructed as a piezo motor for the control of the valves. Specifically, a piezo-electrical transducer comprised of a lamella packet is known with which piezoelectric generated changes of length given the exertion of a force are achieved.

As a rule, a transducer for such a piezoelectric control or positioning element comprising piezo ceramic and, in particular, of a stack of wafers lying on top of one another which are respectively polarized in the direction of their thickness and are electrically connected parallel to the polarization. So as not to destroy the impressed polarization of the piezo-ceramic during operation, the electrical voltage is usually connected with a polarity which promotes the polarization of the ceramic. In the case of such a disk, this means that when such an electrical voltage is applied, it expands in the direction of its thickness, i.e. the entire stack undergoes an increase in height. Thus, pressure can be provided by the control or positioning element when the electrical voltage is operationally applied. However, given the same relationship between the polarization direction and polarity of the voltage to be applied, no increase in the length of the packet (the length measured at right angles to the direction of the thickness of the individual lamella) occurs, given the afore-mentioned packet comprising piezo ceramic lamellae. Rather, a shortening of the length occurs because the $d_{31}$ effect results here. This $d_{31}$ effect, moreover, has the disadvantage that the change in length of the lamella packet amounts to only approximately ½ of the enlargement of the thickness of the lamella packet which simultaneously occurs. If, however, the lamella packet is made a multiple which is longer than the thickness of an individual lamella of the packet, then one obtains a change of length that is nonetheless comparatively much greater than a pellet stack of the same length.

SUMMARY OF THE INVENTION

An object of the present invention is to specify techniques with which a piezoelectric transducer exerting tension and pressure during operation can be employed in the form of a lamella packet in a control or positioning element to be electrically actuated, namely as a transducer element preferably exerting direct force (functioning without lever transmission and the like).

According to the invention, the lamellae of the transducer are disposed in the packets at intervening spaces from one another. The intervening spaces between two respective lamellae are filled up by a respective spacer. A respective power transmission element is rigidly attached to the ends of the lamella packet and the lamellae and spacers are connected to one another so that they cannot be displaced with respect to one another.

The invention proceeds from a consideration that stacks of wafers layered on top of one another are unsuitable for a piezoelectric transducer of the type occurring here, particularly in view of the adhesive layers with a lower modulus of elasticity situated between the wafers. The invention utilizes a transducer in the form of a long bar-shaped lamella packet in which the individual lamellae connected to one another extend in one piece from one end to the opposite end of the packet. Tensile stress must be taken into consideration as the manipulated variable of the transducer element for the operation typically under consideration. Operating principles causing pressure force for such a lamella packet require a certain greater electrical expense. This expense, for example, consists of condtinuously charging the transducer packet with an electrical bias voltage which promotes the polarization and for carrying out the control operation by means of short-circuiting the voltage or by means of applying a countervoltage.

According to a feature of the invention, the ends of the lamella packet are connected to a power transmission element which can, for example, have an eyelet, a hook, a thread or a peg to be chucked or the like with which tensile stress can also be transmitted. It should be taken into consideration in this context that the motion stroke of such a control element is very small and therefore a tolerance-free, rigid coupling of the power transmission element of the part following in the power train such as, for example a valve tappet, must be possible. The invention comprises measures with which the necessary tight connection of the power transmission element and the end of the transducer packet can be securely and permanently achieved and guaranteed.

Further explanations of the invention and, in particular, embodiments of such a tight connection in conjunction with the structure of the lamella packet, proceed from the following detailed description given on the basis of the drawings.

DESCRIPTION OF THE PREFERRED EMBODIMENTS

Figure 1:
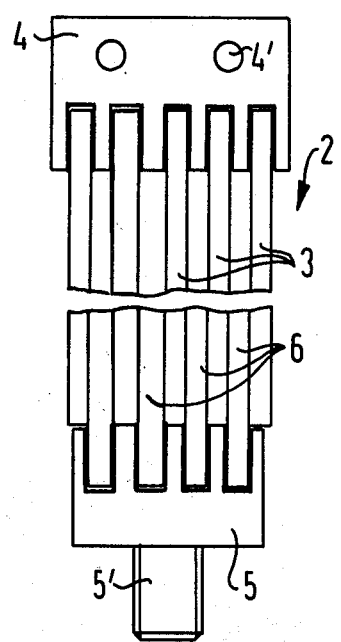
FIGS. 1 and 2 show different side views of a first embodiment of the invention.
Figure 2:
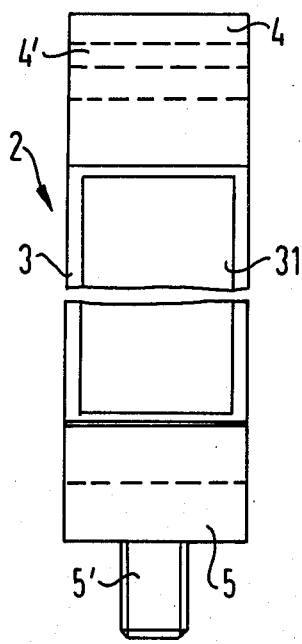

In two side views on different sides, FIGS. 1 and 2 show a transducer which is suitable for a control or positioning element and has piezo-ceramic lamellae 3. One power transmission element is referenced 4 and the other is referenced 5, both being rigidly attached to the two opposite ends of the transducer 2.

The lamellae 3 comprise piezo-ceramic such as, for example, lead zirconate titanate, which has been developed by means of additives in a known manner with regard to its piezo-electric efficiency and, in particular, has relatively low vibrational quality (lead zirconate titanate with neodymium additive). It can already be seen on the basis of FIG. 1 that the packet of the transducer 2 does not exclusively consist of such piezo-ceramic lamellae 3, but that a spacer 6 can also be provided between two respective lamellae, said spacer completely filling the interstice between two neighboring lamellae. Just as in a packet with ceramic lamellae lying tightly against one another, a transducer according to the embodiment of FIGS. 1 and 2 also has a tight material packing. In accordance with the thickness ratio between the thickness b of the ceramic lamellae 3 and the thickness d1 of the spacers 6, such a transducer 2 with spacers 6 has a correspondingly reduced piezo effect for the expansion of length. This reduction of the piezo effect, however, is not to be viewed as a disadvantage but, rather, such a heterogeneously layered structure according to FIG. 1 has a particularly high flexural stiffness as a result of the increased width b of the transducer 2.

The lamellae 3, and preferably the spacers 6 as well, extend in one piece over the entire active length L of the transducer 2, i.e., without an interruption.

Insofar as the spacers 6 do not already have low flexural stiffness in the direction of length L, i.e., that an individual spacer 6 has a significantly lower spring stiffness in the respective direction L in comparison to the individual ceramic lamella 3, the spacers have no significant influence on the piezoelectric force exertion of the lamellae 3. An upper limit for the spring stiffness of the spacers 6 with respect to two of the lamellae is given when the respective spring stiffness becomes approximately equal. The spring stiffness of the lamella 3 and spacer 6 derives from the modulus of elasticity $E_K$ of the ceramic of the lamella 3 and from the modulus of elasticity $E_A$ of the spacer which is effective overall. Either a uniform value for the value $E_A$ is important, given a uniform material of the spacer, or $E_A$ can also be an integral value which derives from the corresponding values of individual components which together form the spacer 6.

The spacer 6 can, for example, be a material such as foamed polyurethane or foamed polystyrol which is preferred when low spring stiffness and relatively high attenuation is desired due to the material of the spacer 6. The spacer 6, however, can also be composed of a plurality of components such as, for example, a glass fiber fleece which is saturated with epoxy resin which is commercially available as, for example, a "Prepreg".

Figure 3:
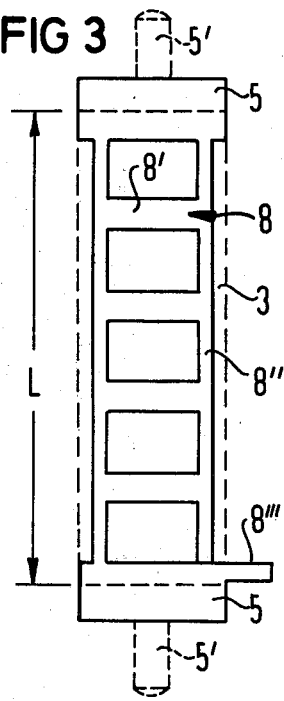
FIGS. 3 and 4 show embodiments for spacers to be inserted between the lamellae.
Figure 4:
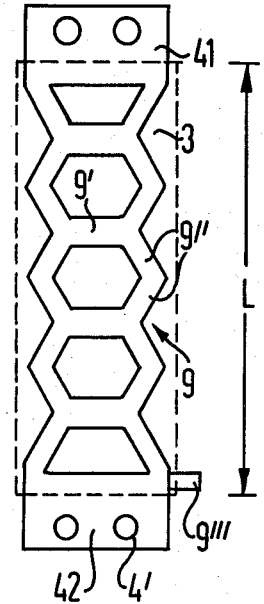

A further example of an embodiment of a spacer 6 is shown in FIGS. 3 and 4 in a view corresponding to that of FIG. 2. Together with the synthetic resin situated on one side of the metal foil or on both sides, the illustrated metal foil 8, 9 forms the spacer 6. The views of FIGS. 3 and 4 show the ladder-shaped design of the metal foils according to embodiments 8 and 9. The metal foil 8 has relatively wide bars 8' in the direction of length L and has relatively narrow longitudinal strips 8" in the direction perpendicular to L. The dimensioning of the longitudinal strips 8" produces a relatively low spring stiffness in the direction L. The bars 8' likewise add nothing to the spring stiffness in the direction L since the sum of the values of the widths of the individual cross bars 8' is still small in comparison to the overall length L. However, the bars 8' function advantageously in a direction at right angles to the length L, i.e. parallel to the width of the lamellae 3. They prevent an expansion (as well as contraction) in the direction of the width of the lamella. This benefits the piezoelectric cross-effect which is effective in direction L, i.e., it increases the piezoelectric dynamic effect and the degree of the piezoelectric length change Δ L of the transducer 2. That which has been said concerning the cross bars 8' also applies to the cross bars 9' of the metal foil 9 of FIG. 4. In order to further reduce the spring stiffness of the metal foil 9 in the direction L, the longitudinal strips 8" designed straight in FIG. 3 are designed here as bent strips 9".

FIGS. 3 and 4 show terminal lugs referenced 8''' or, respectively, 9''' for the electrical voltage supply which can also be employed as such when an electrical connection between the metal foils 8 or 9 and the surface electrode of the lamellae 3 is given. These surface electrodes are surface metallizations, for example, enamelling silvering, of the mutually opposite surfaces extending perpendicular to the thickness d. Because of the high dielectric constant of the piezo-ceramic material, it is necessary that the electrode effective for the lamella lies flush against the surface of the lamella. Metal layers which have been sputtered on or chemically deposited are particularly favorable in this regard.

In purely schematic manner, FIG. 1 shows how the connection between the power transmission element 4, 5 and the transducer 2 can be provided. As an example, such a dovetailing is provided between the transducer 2 and the power transmission element 4, given which the ceramic lamellae 3 and the prongs of the element 4 engage in one another as illustrated. The advantage of such an embodiment with prongs is that the ceramic of the lamella 3 and the material of the prongs of the element 4 are bonded to one another laterally, and tensile forces of the transducer 2 are applied to the element 4 in the connection as shearing forces between the lateral surfaces of the prongs. As can be seen, the lateral connection surfaces between an individual lamella and an individual prong of the element can advantageously be made a greater multiple than would be the case with the connection surface given only end-to-end connection of the lamella end and the power transmission element 4. The connection between the transducer 2 and the power transmission element 5—as illustrated in FIG. 1—differs, as a further example, from that illustrated for the upper end 4 since the spacers are here connected to the prongs of the power transmission element 5 in such manner as was described above for the ceramic lamellae 3. In embodiments of the invention, the one or the other manner of connection can be optionally provided at the one or at both ends 4, 5 as well.

Two different alternatives of an embodiment of the power transmission element 4, 5 for transmission of the power flux, are likewise contained in FIG. 1. The power transmission element 4 has one or more eyelets 4' and the power transmission element 5 exhibits a threaded pin 5'. These eyelets 4' can, for example, be provided in all of the existing metal foils as is shown for one foil in FIG. 4. The upper and lower ends 41 and 42 of the foil 9 projecting beyond the length L has two holes corresponding to these eyelets 4', and the ends 41 together form the power transmission element 4 and the ends 42 together form the power transmission element 5. Given such an embodiment, the length of the ceramic lamellae 3 can preferably be limited to the length L. The ends 41 (and also 42), for example, can be soldered or bonded to one another or can be entirely or partially filled up with added parts and/or can be additionally bonded in order to form a block-shaped body. Something similar can be provided for all of the metal foils 8 according to FIG. 3 in a transducer 2. All of the upper ends of all foils 8 of a transducer 2 can form the one power transmission element 25 (similar to 5 in FIG. 1)

and all of the other ends of the foils 8 can form the other similar power transmission element 26, whereby a threaded pin 25' or 26' indicated with broken lines can be attached at these two ends.

Figure 5:
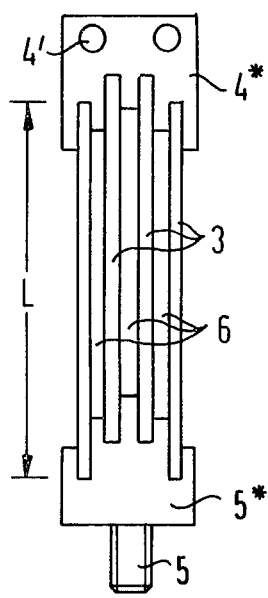
FIGS. 5 through 7 show specific embodiments of lamellae and power transmission elements corresponding to one another.

FIG. 5 shows another development of an embodiment for the connection of the lamella packet of the transducer 2 to the power transmission elements 4* and 5*. As can be seen, all lamellae 3 are equal in length to one another. However, they are disposed offset with respect to one another in the direction of the length L, so that their chucking parts do not respectively lie at the same height in the elements 4* and 5*. Accordingly the compressive strength can be significantly reduced at this location. Therefore, the prongs of the elements 4* and 5* have different lengths such that the longest prong in element 4* is respectively at the outside and the longest prong in the case of element 5* lies at the inside with respect to the packet. The material which forms the aforementioned spacer 6 is situated between the lamellae 3 and can also be designed with metal foil analogous to FIGS. 3 and 4.

Figure 6:
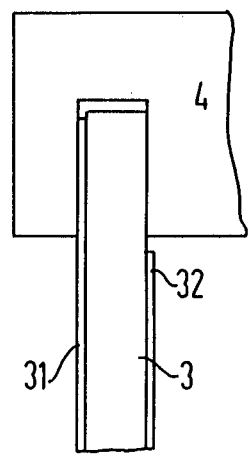

As already mentioned above, the lamellae have electrodes at their surfaces. In an enlargement, FIG. 6 shows a partial view which shows how the electrode 31 of the one surface side of the lamella 3 projects into the power transmission element 4 which here preferably consists of metal. In contrast thereto, the electrode 32 does not even extend up to the element 4 and accordingly is electrically insulated from the element 4. However, just like the electrode 31 and the element 4, the electrode 32 can project into the element 5 at the other, lower end of the lamella 3 (not illustrated). By so doing, the electrical connection for the electrodes of the lamella 3 can be provided in such manner that the element 4 forms the one common terminal for all lamellae and the element 5 produces the other common terminal.

Figure 7:
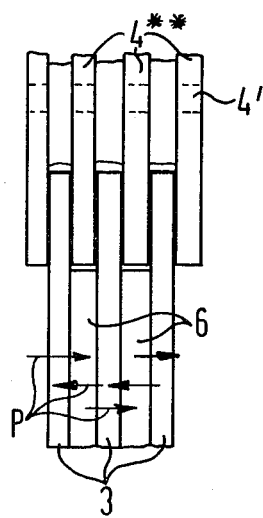

As an example, FIG. 7 shows another embodiment, namely of the power transmission element on the one hand and of the spacers on the other hand. As shown, the power transmission element consists of a plurality of individual strip pieces 4 which have holes 24' as eyelets. These strip pieces 4 partially lie between the lamellae 3. The intervening spaces between these strip pieces 4** outside of the area of the lamellae 3 can, for example, be cast with synthetic resin 35 which, in particular, contains a hard filling compound. The intervening space can also be filled up by means of adhesion or soldering whereby auxiliary parts consisting of metal, ceramic, plastic or the like can additionally be inserted.

As an example, FIG. 7 also shows the embodiment in which the spacers 6 between the lamellae 3 are likewise piezo-ceramic lamellae. These additional piezo-ceramic lamellae are connected surface-wise to the respective lamellae 3 adjacent at both sides so that the piezoelectric dynamic effect which arises in the additional piezoelectric lamellae forming the spacers 6 can be transmitted via the lamellae 3 to the power transmission element 4**. The adhesive or casting compound situated between the lamellae lying on top of one another also serves to balance out certain thickness tolerances. For the piezoelectric excitation of the additional lamellae forming the spacers 6, their surfaces like those of the lamellae 3 have an electrode metallization. If one also selects the polarization direction P in the additional lamellae to be opposite the polarization direction P in the lamellae 3, the surfaces of a lamella 3 and of an additional lamella forming the spacer 6 lying on top of one another can be a common electrode.

In a simple manner, these additional lamellae then promote the dynamic effect of the lamellae 3 which are already provided.

Figure 8:
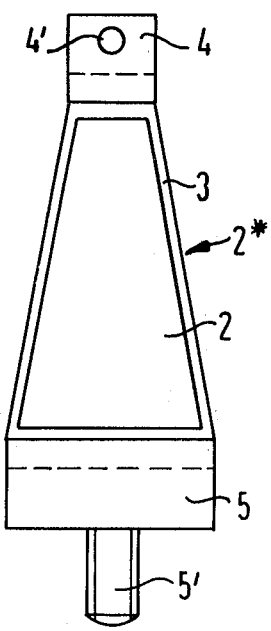
FIG. 8 shows a special embodiment for high-speed adjustment.

In a side view corresponding to that of FIG. 2, FIG. 8 shows a control or positioning element with a trapezoidal transducer 2*. The view of this embodiment corresponds to that of FIG. 1 and does not differ from that of FIG. 1. The electrode 2'' is correspondingly trapezoidal here. When this control or positioning element according to FIG. 8 is connected with its broad end, i.e., with the power transmission element 5, to the mass of a device or of an apparatus, particularly no motion occurs at the power transmission element 5. Therefore, the embodiment according to FIG. 8 has the advantage that the end of the control element at which the power transmission element 4 is situated can execute faster alternating motions than would be the comparative case for an embodiment according to FIGS. 1 and 2. The control element with the transducer 2* has comparatively less mass in that area where high speeds occur than at those parts of the transducer 2* lying close to the power transmission element 5. Thus, no loss of setting force is associated therewith since the contribution of parts of the transducer 2* in the area of high speeds of the transducer is lower. As shown in FIGS. 1, 5, and 7, the end pieces connect to the lamellae in tooth-like fashion (see respective reference numerals 30, 31, and 32).

Although various minor modifications may be suggested by those versed in the art, it should be understood that we wish to employ within the scope of the patent warranted hereon, all such embodiments as reasonably and properly come within the scope of our contribution to the art.

We claim as our invention:

1. An electrically actuated piezoelectric control element comprising: a transducer formed of a plurality of lamellae of piezoelectric material which are of one piece construction in an actuation direction and provided with electrodes, said lamellae being combined to form a packet; a length of the lamellae being at least five times as great as a thickness of the individual lamella and the lamellae all having substantially a same thickness; the lamellae length and a length of the packet from end to end being shortened or lengthened by the piezoelectric effect upon application of an electric voltage depending on an operational sign of said voltage and the polarization of the material; each and every one of the lamellae being disposed in the packet at intervening spacings from one another and the intervening spaces existing between all adjacent lamellae being filled up by a respective spacer; a power transmission element being rigidly attached in dove-tailed fashion to the two ends of the lamella packet; and the lamellae and spacers being connected to one another such that they cannot be displaced with respect to one another.

2. A control element according to claim 1 wherein the intervening space is filled up with material such that the individual spacer has a spring stiffness between the ends of the packet which is smaller than a spring stiffness existing between the ends of an individual lamella.

3. A control element according to claim 2 wherein the intervening space is filled up with synthetic resin casting compound as a spacer.

4. A control element according to claim 2 wherein a strip comprising glass fiber fleece saturated with synthetic resin is provided in the intervening space.

5. A control element according to claim 2 wherein the intervening space is filled up with a metal strip with synthetic resin situated on at least one side thereof.

6. An electrically actuated piezoelectric control element, comprising: a transducer formed of a plurality of lamellae of piezoelectric material which are of one piece construction in an actuation direction and provided with electrodes, said lamellae being combined to form a packet; a length of the lamellae being at least five times as great as a thickness of the individual lamella and the lamellae all having substantially a same thickness; the lamellae length and a length of the packet from end to end being shortened or lengthened by the piezoelectric effect upon application of an electric voltage depending on an operational sign of said voltage and the polarization of the material; the lamellae being disposed in the packet at intervening spacings from one another and the intervening spaces existing between two lamellae being filled up by a respective spacer; a power transmission element being rigidly attached in dove-tailed fashion to the two ends of the lamella packet; the lamellae and spacers being connected to one another such that they cannot be displaced with respect to one another; the respective intervening space being filled up with material such that the individual spacer has a spring stiffness between the ends of the packet which is smaller than a spring stiffness existing between the ends of a respective individual lamella; the intervening space being filled up with a metal strip with synthetic resin situated on at least one side thereof; and the metal strip having a ladder shape with bars which proceed laterally, and with longitudinal strips which are relatively thin in comparison thereto.

7. A control element according to claim 1 wherein at least one of the power transmission elements is formed by means of strip pieces which extend with a first portion between the lamellae of the lamella packet and whose remaining portion projects beyond the lamella packet.

8. A control element according to claim 1 wherein the spacer comprises at least in part a material having an attenuating property for controlling oscillations of the packet.

9. A control element according to claim 1 wherein at least one end of the lamella packet and the power transmission element connecting to the packet are connected to one another in a dovetailed manner such that prongs of the lamella packet are end pieces of the lamellae, wherein a length of the prongs is at least equal to three times the thickness of the individual lamellae, and wherein the power transmission element has intermediate portions laterally firmly bonded to lateral opposing surfaces of the prongs.

10. An electrically actuated piezoelectric control element, comprising: a transducer formed of a plurality of lamellae of piezoelectric material which are of one piece construction in an actuation direction and provided with electrodes, said lamellae being combined to form a packet; a length of the lamellae being at least five times as great as a thickness of the individual lamella and the lamellae all having substantially a same thickness; the lamellae length and a length of the packet from end to end being shortened or lengthened by the piezoelectric effect upon application of an electric voltage depending on an operational sign of said voltage and the polarization of the material; the lamellae being disposed in the packet at intervening spacings from one another and the intervening spaces existing between two lamellae being filled up by a respective spacer; a power transmission element being rigidly attached in dove-tailed fashion to the two ends of the lamella packet; the lamellae and spacers being connected to one another such that they cannot be displaced with respect to one another; at least one end of the lamella packet and the power transmission element connecting to the packet being connected to one another in a dovetailed manner such that prongs of the lamella packet are end pieces of the lamellae; a length of the prongs being at least equal to three times the thickness of the individual lamellae; and the prongs of the power transmission element being unequal in length but having a same bonding length, and all the lamellae having a uniform length.

11. An electrically actuated piezoelectric control element, comprising: a transducer formed of a plurality of lamellae of piezoelectric material which are of one piece construction in an actuation direction and provided with electrodes, said lamellae being combined to form a packet; a length of the lamellae being at least five times as great as a thickness of the individual lamella and the lamellae all having substantially a same thickness; the lamellae length and a length of the packet from end to end being shortened or lengthened by the piezoelectric effect upon application of an electric voltage depending on an operational sign of said voltage and the polarization of the material; the lamellae being disposed in the packet at intervening spacings from one another and the intervening spaces existing between two lamellae being filled up by a respective spacer; a power transmission element being rigidly attached in dove-tailed fashion to the two ends of the lamella packet; the lamellae and spacers being connected to one another such that they cannot be displaced with respect to one another; at least one end of the lamella packet and the power transmission element connecting to the packet being connected to one another in a dovetailed manner such that prongs of the lamella packet are end pieces of the lamellae; a length of the prongs being at least equal to three times the thickness of the individual lamellae; and given an electrically conductive power transmission element, the one electrode of the respective individual lamellae projecting together with said lamella into the dovetailing part of the power transmission element as an electrical connection of said electrode to the power transmission element.

12. A control element according to claim 1 wherein in addition to lamellae in the packet directly connected to the power transmission element, further lamellae comprising a same piezoelectric material are provided which form the spacers, these spacers being connected surface-wise to the lamellae so as to generate additional control force as further, active lamellae, and so as to transmit said control power via the lamellae to the power transmission element.

13. An electrically actuated piezoelectric control element, comprising: a transducer formed of a plurality of lamellae of piezoelectric material which are of one piece construction in an actuation direction and provided with electrodes, said lamellae being combined to form a packet; a length of the lamellae being at least five times as great as a thickness of the individual lamella and the lamellae all having substantially a same thickness; the lamellae length and a length of the packet from end to end being shortened or lengthened by the piezoelectric effect upon application of an electric voltage depending on an operational sign of said voltage and the polarization of the material; the lamellae being disposed in the packet at intervening spacings from one another and the intervening spaces existing between two lamellae being filled up by a respective spacer; a power transmission element being rigidly attached in dove-tailed fashion to the two ends of the lamella packet; the lamellae and spacers being connected to one another such that they cannot be displaced with respect to one another; and the lamellae and spacers having a trapezoidal shape.

14. A control element according to claim 1 wherein the power transmission element is designed so that it surrounds an attachment means for connecting the power transmission element to further parts for transmitting power.

15. A control element according to claim 14 wherein the attachment means is preferably a peg provided with a thread.

16. A control element according to claim 1 wherein the piezoelectric material is piezo-ceramic.

17. An electrically actuated piezoelectric control element, comprising: a plurality of lamellae each comprising a piezoelectric material stacked to form a packet; a length of the lamellae being at least five times as great as a thickness of the individual lamella and the lamellae all having substantially a same thickness; each of the lamellae being designed such that upon application of an electrical voltage for a given polarization of the material the length of the individual lamellae and the packet length changes; each and every one of the lamellae being disposed in the packet at given spacings from one another with intervening spaces therebetween being filled by a spacer adjacent each of the lamellae; and a power transmission element rigidly attached at the ends of the lamella packet.

* * * * *